United States Patent [19]
Maher

[11] B 3,988,498
[45] *Oct. 26, 1976

[54] LOW TEMPERATURE FIRED ELECTRICAL COMPONENTS AND METHOD OF MAKING SAME

[75] Inventor: Galeb H. Maher, Adams, Mass.

[73] Assignee: Sprague Electric Company, North Adams, Mass.

[ * ] Notice: The portion of the term of this patent subsequent to May 21, 1991, has been disclaimed.

[22] Filed: Apr. 4, 1974

[21] Appl. No.: 457,886

[44] Published under the second Trial Voluntary Protest Program on January 13, 1976 as document No. B 457,886.

Related U.S. Application Data

[63] Continuation-in-part of Ser. No. 206,402, Dec. 9, 1971, Pat. No. 3,811,937.

[52] U.S. Cl. ............................. 428/434; 317/258; 317/261; 427/79; 427/376 R; 428/433
[51] Int. Cl.² ..................................... B05D 5/12
[58] Field of Search ................. 117/217, 215, 221; 317/258, 261; 161/196; 106/53, 54; 427/79, 376; 428/434, 433

[56] References Cited
UNITED STATES PATENTS

| | | | |
|---|---|---|---|
| 2,889,952 | 6/1959 | Claypoole | 106/53 |
| 3,331,777 | 7/1967 | Hoffman | 106/53 |
| 3,365,631 | 1/1968 | Delaney et al. | 317/258 |
| 3,400,001 | 9/1968 | Hasumi et al. | 317/258 |
| 3,495,996 | 2/1970 | Delaney et al. | 317/258 |
| 3,600,652 | 8/1971 | Riley | 317/258 |
| 3,638,084 | 1/1972 | Burn | 317/258 |
| 3,653,933 | 4/1972 | Tsunekawa | 106/54 |
| 3,682,840 | 8/1972 | Van Loan | 106/53 |
| 3,784,887 | 1/1974 | Sheard | 317/258 |
| 3,799,754 | 3/1974 | Thomas | 106/54 |
| 3,811,937 | 5/1974 | Maher | 117/217 |

*Primary Examiner*—Cameron K. Weiffenbach
*Attorney, Agent, or Firm*—Connolly and Hutz

[57] ABSTRACT

A low temperature fired glass-ceramic system encompassing a series of temperature compensating bodies having temperature coefficients that cover a wide range and possessing dielectric constants of from 30 to 125. This system consists of a mixture of a prefired blend of baria, titania and rare earth oxides, and a low firing glass formulation wherein the mixture is fired within the temperature range of 1,800° F to 2,100° F. A slip suspension of this mixture can be used to manufacture monolithic capacitors that utilize a relatively inexpensive palladium-silver electrode.

10 Claims, 3 Drawing Figures

LOW TEMPERATURE FIRED ELECTRICAL COMPONENTS AND METHOD OF MAKING SAME

CROSS REFERENCES TO RELATED APPLICATIONS

The present application is a continuation-in-part of U.S. Pat. application Ser. No. 206,402 filed Dec. 9, 1971, now U.S. Pat. No. 3,811,937.

BACKGROUND OF THE INVENTION

This invention relates to a low temperature fired glass-ceramic system and a method of making same, and more particularly to components that are made with a low firing glass formulation that is mixed with a ceramic blend containing baria, titania and a rare earth oxide.

Conventional ceramic compositions must be fired to maturity at relatively high temperatures - above 2,250°F. When a multilayered capacitor employing a high temperature ceramic is formed, the electrodes must be high melting and inert under the capacitor forming conditions. Palladium, one of the platinum group metals employed as the electrode material in this type of a capacitor unit, presently sells for about $105.00 per troy ounce. If the capacitor firing temperature can be reduced significantly, without greatly sacrificing capacitance per volume, then the less expensive electrode materials such as silver, which sells for about $4.85 per troy ounce, or silver-palladium alloys can be employed.

Prior art attempts at overcoming this problem have met with limited success. Such success has come however with some sacrifice in dielectric constants and/or with a rather narrow range of temperature coefficients.

Accordingly, it is an object of the present invention to produce a low firing temperature ceramic body that can utilize a relatively inexpensive electrode material and possess characteristices suitable to electrical components.

It is another object of the present invention to provide a low firing temperature ceramic body that has a rather wide range of temperature coefficients and relatively high dielectric constants.

SUMMARY OF THE INVENTION

A high temperature ceramic blend and a low firing glass formulation are mixed together and fired at a temperature of between 1,800°F and 2,100°F. The high temperature ceramic blend is a prefered mixture of baria, titania and a rare earth oxide, such as neodymium oxide. For negative temperature coefficient bodies from N200 to N1000, the high temperature ceramic is a blend of the prefered mixture of baria, titania and the rare earth oxide above plus calcium titanate added thereto. These are the same ceramic blends described in the above mentioned application Ser. No. 206,402. The low firing temperature glass formulation has a melting point less than 1600°F and contains at least one of the glass forming oxides $B_2O_3$ or $SiO_2$ in a total amount 5–30% by weight and optionally the glass modifier oxide $Al_2O_3$. The glass formulation also contains from 35–85% by weight of the oxides $Bi_2O_3$ and/or PbO. Up to 20% CdO and up to 15% ZnO may also be included for adjustment in the glass melting temperature and TC of the final dielectric ceramic body. The combination of these ceramic and glass compositions together produces a low firing temperature ceramic body that can utilize a relatively inexpensive electrode system and has a range of temperature coefficients of from −1000 ppm/°C to +200 ppm/°C, with dielectric constants in the range of 125 to 30, respectively.

The rather low firing glass-ceramic composition of the present invention can be employed in forming capacitors, resistors, thermistors, etc., which utilize electrode, resistor or thermistor films of low sintering or low firing temperature materials such as gold, silver, copper, certain silver-palladium alloys, or alloys of any combination thereof.

An electrical component comprising the low temperature fired ceramic body of the present invention will consist essentially of 70 to 92% of the high temperature ceramic and 8 to 30% of the low firing temperature glass formulation, and will have at least one metallic film located within said body. The metallic film can be a resistance material at the lower end of the firing range, a planar inductance coil, or when at least two metallic films are within said body separated by a layer of said ceramic, the structure will define a capacitor. A component obviously may include all three electrical components.

DESCRIPTION OF THE PREFERRED EMBODIMENTS

Figure 1:
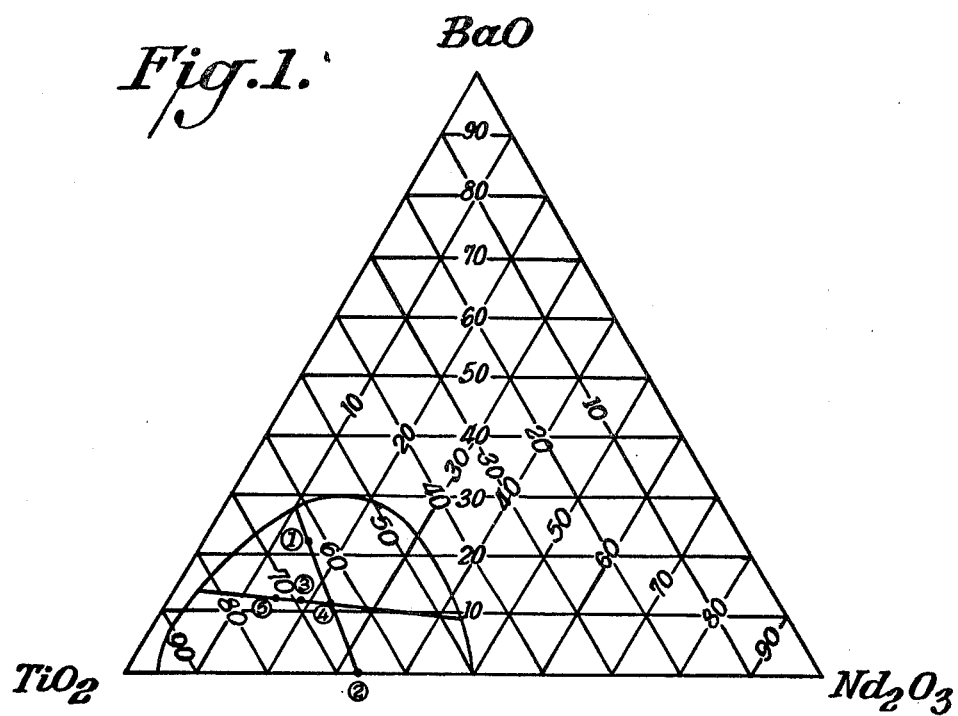
FIG. 1 is a ternary diagram of the high temperature composition of the present invention.

The present invention involves a glass-ceramic system that is fired at a relatively low temperature, and, therefore, can utilize a relatively inexpensive electrode system in electrical components.

The high temperature ceramic system of the dielectric bodies of this invention is either a prefered blend of baria, titania and a rare earth oxide, or this prefered blend plus a proportion of calcium titanate added thereto. Fully sintered compositions in this ternary system consist, in most cases, of several phases. The compounds of the high temperature ceramic system are present therein in the following amounts (in mole percent): 0–30% baria, 45–95% titania, and 5–50% of a rare earth oxide. The particular amounts will depend on the particular electrical characteristics desired. The prefered blend described above maintain its identity through subsequent firings.

The glass compositions of the present invention contain over 35% by weight of the oxides of bismuth or lead or the combination of the two. The temperature coefficient (TC) characteristic of the glass-reacted-ceramic dielectric may be adjusted by varying the relative quantities of these two oxides. The glass composition of this invention may contain additives of up to 20% weight percent of cadmium oxide, which in this formulation tends to reduce the glass melting temperature. Additions of zinc oxide of up to 15% weight percent is also particularly useful for making adjustments in the TC as well as in the glass coefficient of expansion.

Some specific glass-reacted-ceramic bodies of this invention are described below. The examples contain 80% of a dielectric ceramic formulation that consists of 40% $TiO_2$, 17.5% BaO and 42.5% $Nd_2O_3$ by weight.

The corresponding proportions in mole percent are 67.6 $TiO_2$, 15.4 BaO and 17 $Nd_2O_3$. The various compositions, $G_1$–$G_4$, for the glass of the examples is given in Table 1, the constituent oxides being given in weight percent.

Table 1

| Glass Compositions | | | | |
|---|---|---|---|---|
| | $G_1$ | $G_2$ | $G_3$ | $G_4$ |
| $B_2O_3$ | 13.0% | 3.39% | 2.88% | 6.5% |
| $SiO_2$ | 12.5 | 2.93 | 2.49 | 6.25 |
| $Al_2O_3$ | 2.5 | 0.81 | 0.69 | 1.25 |
| ZnO | 10.0 | 1.98 | 1.68 | 5.0 |
| CdO | 0 | 0 | 15.0 | 0 |
| $Bi_2O_3$ | 0 | 90.8 | 77.2 | 0 |
| PbO | 62.0 | 0 | 0 | 81.0 |

In Table II is provided a summary of the test data taken on capacitors employing the glass-reacted-ceramic containing each of the four glass compositions defined in Table 1.

Table II

Electrical Properties of Glass Reacted Ceramic Capacitors using Glasses $G_1$ – $G_4$

| Samples Fired at 1950°F, 40 mins. soak | | | | | |
|---|---|---|---|---|---|
| | | $G_1$ | $G_2$ | $G_3$ | $G_4$ |
| Average Dielectric Constant at 1KHz, | 25°C | 55 | 54 | 60 | 85 |
| Dissipation Factor % at 1KHz | 25°C | 0.03 | .05 | .04 | 0.18 |
| TC | −55°C | N15 | N80 | N65 | N200 |
| PPM/°C | +85°C | P3 | P50 | N45 | N170 |
| | +125°C | P6 | P70 | N40 | N300 |
| Samples Fired at 2050°F, 40 mins, soak | | | | | |
| Average Dielectric Constant at 1KHz, | 25°C | 60 | 69 | 66 | 68 |
| Dissipation Factor % at 1KHz | 25°C | 0.03 | 0.03 | 0.04 | 0.10 |
| TC | −55°C | N11 | N64 | N63 | P130 |
| PPM/°C | +85°C | P5 | N55 | N58 | P100 |
| | +125°C | P9 | N50 | N53 | P90 |

The sample glass compositions were formed by mixing the oxides taken in powder form in proportions as shown in Table 1. The blend was melted in a platinum crucible at 1,000°C, then quenched, premilled by wet ball milling with deionized water so the mixture was about 70% solids. This mixture was milled for about 15 hours to achieve a particle size of less than 1 micron. The mixture was then dried and granulated and ready for combining with powders of the prefired ceramic composition. An exception in this procedure was made in the forming of glass sample $G_4$, wherein the lead oxide powder was simply added to the pre-reacted glass powder containing the other oxides. It is noted that the sample bodies containing glass composition $G_2$ and $G_3$ and fired at 1,950°F were slightly porous and showed useful but slightly inferior electrical properties compared with the other samples. Firing these formulations at 2,050°F provided non-porous bodies and excellent dielectric properties. Of course, as has been explained, an increase in the glass content to for example 25% would provide a more homogeneous body when fired at 1,950°F.

A portion of the prefired high temperature ceramic ranging from 70 to 92% by weight is blended with a portion of the low firing glass formulation ranging from 8 to 30% by weight in a suitable organic binder. Amounts of each component part outside of this range will form bodies, but these bodies will not possess the electrical properties desired herein. The blend is ball milled from 6 to 20 hours to achieve grain size in the range of 1 micron. The slurry is then cast, sprayed or drawn in thin layers to form the body desired.

Bodies produced herein, can utilize silver-palladium alloys in the range of 60 to 85% silver and 15 to 40% palladium depending on the final firing temperature of the glass-ceramic dielectric. Accordingly, ceramic capacitors can be made herein with silver-palladium electrodes that are much less expensive than prior art units made without the low firing glass formulation. The finished body is fired between 1,800°F and 2,100°F depending on the particular glass-to-ceramic ratios, i.e., the higher the glass content, the lower the firing temperature.

The desired composition of the baria-titania-rare earth oxide is prepared by wet ball milling titanium dioxide with barium carbonate and rare earth hydroxides, hydrates, oxalates, carbonates or oxides for several hours. The slurry is then dried around 150°C, granulated and calcined between 2,250°F to 2,600°F, depending on the particular composition. Referring to the drawings, FIG. 1 shows a ternary diagram of the dielectric ceramic compositions of the present invention which are the same as described in the pending application Ser. No. 206,402.

The TC bodies described herein cover a range of temperature of −55°C to +125°C and are designated by a number with a letter prefix. The prefix P means a positive temperature coefficient slope where the capacitance will rise with an increase in temperature; N means the capacitance will drop (negative coefficient); and NPO signifies no change. Thus, a designation of N100 means that for every degree centigrade that the temperature increases, the capacitance will drop 100 parts per million.

Figure 2:
FIG. 2 shows a cross-section of a capacitor unit employing the ceramic of this invention.

FIG. 2 shows a capacitor unit 10 employing the low firing temperature ceramic of this invention wherein metallic film layers 11 are extended into the middle of the capacitor unit from alternate sides separated by layers of the said ceramic material 12 forming a capacitor. The metallic film layers 11 buried within the glass-ceramic of the present invention is preferably a silver-palladium alloy since the final capacitor is fired at a temperature of from 1,800°F to 2,100°F. The final composition of palladium and silver going into the body depends on the final firing temperature of the formed body. The final firing temperature is primarily determined by the amounts of glass in the body. Thus when the glass content in the body increases, the dielectric constant of the body decreases and it is preferred that the body contain no more than 30% glass. So the higher the glass content of the body, the higher percentage of silver in the electrode system. The metallic film layers 11 should have a melting point above the firing temperature of the body, but not substantially greater than the firing temperature. Generally, the maximum firing temperature of the body should always be about 50°F below the solidus line of the particular silver-palladium electrode composition used thereon.

In forming an inductor the same low firing temperature ceramic body can be employed and it may or may not contain ferromagnetic material. For a much higher inductance a ferrite or high ferromagnetic system can be employed. A coil pattern of silver, gold, silver-palladium alloys, etc., can be screened on the substrate while it is in the green state and then a top layer of the inventive composition can be applied to form a monolithic inductor.

Figure 3:
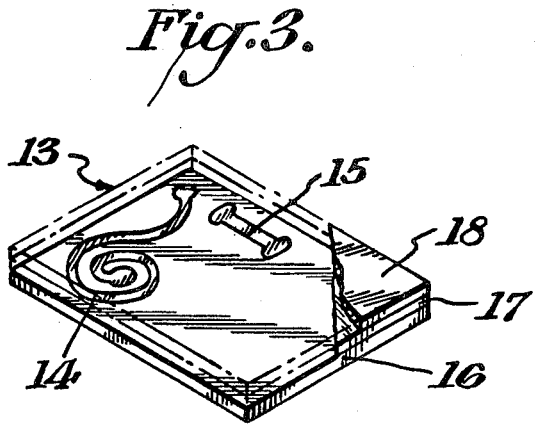
FIG. 3 illustrates a microcircuit that is within the scope of this invention.

FIG. 3 shows a microcircuit 13 having ceramic layers 16, 17 and 18 composed of the low firing temperature glass-ceramic of the present invention. Positioned between layers 16 and 17 are inductor 14 and a resistor 15.

In the ternary diagram of FIG. 1, TC bodies other than the examples shown therein can be formed as shown along the extrapolated lines connecting the bodies described, also other compositions within the prescribed semi-circle may be selected for specific applications. TC bodies between, for example, P100 and N100 may be formed by simply mixing desired portions of each of these calcined high temperature ceramics and subsequently firing this mixture with a portion of the glass. Various portions of each will give TC bodies ranging from P100 to N100. While bodies formed from compositions outside of this semi-circle will have certain electrical properties and characteristics they will not be as advantageous or desirable as those within the semi-circle.

If negative bodies having high dielectric constants are desired, it has been found that a portion of calcium titanate can be mixed with the high temperature ceramic after the mixture has been fired and then blended to produce such bodies.

The negative TC bodies, such as N750 and N450, can be formed without the addition of calcium titanate, however, the dielectric constants of these bodies are considerably lower than those produced with calcium titanate added thereto. It is therefore preferred to add a portion of calcium titanate to the prefired high temperature ceramic before blending with the low firing temperature glass formulation when negative TC bodies that have advantageously high dielectric constants are desired. It should be noted that the pre-fired high temperature ceramic and the calcium titanate react with the glass independently of each other, each maintaining its own identity in the final body.

The high temperature ceramic calcining temperature can be varied from 2,250°F to 2,600°F depending on the particular electrical properties desired. Separate phases can be calcined individually and then reacted with the glass at lower temperatures (from 1,800°F to 2,100°F) depending on the particular glass-to-ceramic ratios. As a general rule, the higher the glass content, the lower the firing temperature of the final body. Preferably, about 80 weight percent of the high temperature ceramic and 20 weight percent of the glass are combined to form the final bodies herein.

While neodymium oxide ($Nd_2O_3$) is the preferred rare earth oxide for the ternary system, other rare earth compounds can be used with similar, although less desirable, results. However, cerium oxide should be avoided because its electrical properties are not as good as some others. For example, cerium renders the bodies too electrically conductive, lowers the dielectric constant considerably, and produces a higher dissipation factor than when neodymium is used. When lanthanum was mixed with neodymium in equal proportions and used as the rare earth component, similar bodies were formed, but these bodies had slightly lower dielectric constants than the bodies using neodymium as the rare earth component. It should be noted that the rare earth compounds are put into the ternary system as carbonates, hydroxides, hydrates, oxalates, oxides, etc., but upon firing or calcining the net constituents will be the oxides thereof.

It should also be understood that while calcium titanate is preferably added to the high temperature ceramic for producing certain negative TC bodies, other titanates may be used interchangeably with somewhat different results, i.e., lower dielectric constants, or produce less linear temperature coefficient characteristics within the operating temperature range.

In forming a resistor as shown in FIG. 3, any of the well known resistor inks can be employed providing the firing temperature thereof is compatible with the firing temperature of the ceramic substrate. The fabrication of a resistor is very similar to that of a capacitor. The low firing temperature ceramic slip or paste can be deposited on a temporary substrate to any desired thickness. A metal resistor ink can be screened on in any desired pattern, and a top layer of the low firing temperature slip applied over the resistor ink. The resistor can be cut to the desired size in the green state and Ag-Pd terminal pick-ups applied thereto. Thereafter, the units can be fired at the lower portion of the given temperature range.

What is claimed is:

1. An electrical component comprising a low temperature fired ceramic body of a fired blend containing 70 to 92% by weight of a calcined high temperature ceramic mixture and 8–30% by weight of a low firing temperature glass formulation having a melting temperature less than 1,600°F, said calcined ceramic mixture containing from 0–30 mole percent baria, 45–95 mole percent titania and 5–50 mole percent of a rare earth oxide selected from the group consisting of neodymium, lanthanum and mixtures thereof, said glass formulation consisting in weight percent essentially of 5–30% of the glass former oxides selected from the group consisting of $B_2O_3$ and $SiO_2$, 0–5% $Al_2O_3$, 0–15% ZnO, 0–20% CdO, and at least 35% of an oxide selected from the group consisting of $Bi_2O_3$ and PbO; and at least one metallic film located within said ceramic body, said metallic film having a melting point not substantially greater than the firing temperature of said body.

2. The combination of claim 1 wherein said glass formulation consists essentially of:

| | |
|---|---|
| $B_2O_3$ | 13.0% |
| $SiO_2$ | 12.5% |
| $Al_2O_3$ | 2.5% |
| ZnO | 10.0% |
| PbO | 62.0% |

3. The combination of claim 1 wherein said glass formulation consist essentially of:

| | |
|---|---|
| $B_2O_3$ | 3.39% |
| $SiO_2$ | 2.93% |
| $Al_2O_3$ | 0.81% |
| ZnO | 1.98% |
| $Bi_2O_3$ | 90.8% |

4. The combination of claim 1 wherein said fired blend contains a proportion of calcium titanate.

5. The combination of claim 4 wherein said fired blend consists essentially of 20% by weight of the low firing temperature glass formulation and 80% by weight of a mixture of said high temperature ceramic mixture and said calcium titanate.

6. A method of forming a low temperature fired ceramic electrical component by forming a body from a slurry with at least one metallic film within said body, and firing said body, wherein the improvement comprises:
  ball milling a high temperature ceramic mixture of 0–30 mole percent baria, 45–95 mole percent of a rare earth oxide selected from the group consisting of neodymium, lanthanum and mixtures thereof;
  calcining said high temperature ceramic mixture at a temperature of between 2250°F to 2600°F;
  making said slurry of from 70 to 92% by weight of said calcined mixture and from 8 to 30% by weight of a low firing glass formulation consisting in weight percent essentially of 5–30% of the glass former oxides selected from the group consisting of $B_2O_3$ and $SiO_2$, 0–5% $Al_2O_3$, 0–15% ZnO, 0–20% CdO, and at least 35% of an oxide selected from the group consisting of $Bi_2O_3$ and PbO, in a suitable binder; and firing said body at a temperature of between 1800°F and 2100°F.

7. The method of claim 6 wherein said slurry consists of from 70 to 92% by weight of a mixture of calcium titanate and said calcined mixture with from 8 to 30% by weight of said low firing glass formulation.

8. The method of claim 6 wherein said glass formulation consists essentially of:

| | |
|---|---|
| $B_2O_3$ | 13.0% |
| $SiO_2$ | 12.5% |
| $Al_2O_3$ | 2.5% |
| ZnO | 10.0% |
| PbO | 62.0% |

9. The method of claim 6 wherein said glass formulation consists essentially of:

| | |
|---|---|
| $B_2O_3$ | 3.39% |
| $SiO_2$ | 2.93% |
| $Al_2O_3$ | 0.81% |
| ZnO | 1.98% |
| $Bi_2O_3$ | 90.8% |

10. The method of claim 6 wherein said slurry consists of 80% by weight of calcium titanate and said calcined mixture and 20% by weight of said low firing glass formulation, and said at least one metallic film is a silver-palladium alloy in the range of 60–85% silver and 15–40% palladium.

* * * * *